(12) United States Patent
Sugiura

(10) Patent No.: US 7,183,619 B2
(45) Date of Patent: Feb. 27, 2007

(54) SURFACE ACOUSTIC WAVE APPARATUS

(75) Inventor: Tsuyoshi Sugiura, Yokohama (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/911,983

(22) Filed: Aug. 5, 2004

(65) Prior Publication Data
US 2005/0093171 A1 May 5, 2005

(30) Foreign Application Priority Data
Aug. 6, 2003 (JP) ............................. 2003-287734

(51) Int. Cl.
*H01L 29/82* (2006.01)
(52) U.S. Cl. ............... 257/416; 257/777; 257/E23.061
(58) Field of Classification Search ............... 257/777, 257/778, 779, 782, 784, 734, 414, 415–416, 257/678, 254, 685–686; 313/193; 438/108, 438/612; 333/193; 361/784, 790
See application file for complete search history.

(56) References Cited

U.S. PATENT DOCUMENTS 6,184,463 B1 * 2/2001 Panchou et al. .......... 174/52.4

6,512,302 B2 * 1/2003 Mess et al. ................ 257/777
2002/0079567 A1 * 6/2002 Lo et al. .................... 257/685

FOREIGN PATENT DOCUMENTS

JP        09-162691        6/1997

* cited by examiner

Primary Examiner—B. William Baumeister
Assistant Examiner—Dana Farahani
(74) Attorney, Agent, or Firm—Harness, Dickey & Pierce, P.L.C.

(57) ABSTRACT

A SAW apparatus is provided capable of realizing a small size without adverse affect while mounting the active surfaces of the semiconductor integrated circuit and the surface acoustic wave element. The SAW apparatus comprises a semiconductor IC and a SAW element. The semiconductor IC is flip-chip mounted on a bottom of the package, a non-active surface of the SAW element is bonded to a non-active surface of the semiconductor IC by using an adhesive, and an electrode portion arranged in the active surface is wire-bonded to an electrode pattern formed on the side walls of the package by using wires.

8 Claims, 4 Drawing Sheets

SURFACE ACOUSTIC WAVE APPARATUS

RELATED APPLICATIONS

This application claims priority to Japanese Patent Application No. 2003-287734 filed Aug. 6, 2003 which is hereby expressly incorporated by reference herein in its entirety.

BACKGROUND

1. Technical Field

The present invention relates to surface acoustic wave apparatuses, and more specifically, to a surface acoustic wave apparatus having a semiconductor integrated circuit and a surface acoustic wave element such as a surface acoustic wave oscillator.

2. Background Art

Generally, surface acoustic wave (hereinafter, referred to as SAW) apparatuses comprise a SAW element using a SAW which propagates along a piezoelectric element. The wavelength of the SAW is shorter than that of the electromagnetic wave and the propagation speed of the SAW is slow. Therefore, since electronic devices can now be made small using the SAW element, the SAW has been widely used in portable communication terminals such as portable telephones as well as filters, vibrators, and delaying elements. As such, it is still desirable to make the SAW apparatus small.

For example, as shown in FIG. 7, a conventional SAW apparatus has a SAW element 1 and a semiconductor integrated circuit (IC) 2 which are juxtaposed with each other, while their electrodes are wire-bonded. A SAW apparatus having the above structure has problems in that it needs to secure a sufficient mounting space (cavity) for the SAW element 1 and the IC 2 on the surface of the substrate 3, which limits the miniaturization of the SAW apparatus.

In view of the drawbacks of the conventional SAW apparatus, an apparatus as disclosed in Japanese Unexamined Patent Application Publication No. 9-162691 is suggested. The SAW apparatus disclosed in Japanese Unexamined Patent Application Publication No. 9-162691 is shown in FIG. 8. In this SAW apparatus, an IC 2 is mounted on a surface of a substrate 3 to be wire-bonded to electrodes, and a SAW element 1 is mounted above an active surface of the IC 2 with bumps 4 interposed therebetween. Because the SAW element 1 is flip-chip mounted on the active surface of the IC 2, the SAW element 1 and the IC 2 are mounted with their active surfaces facing each other.

With a SAW apparatus having the above construction, it is possible to reduce the mounting area for the substrate and consequently the size of the resulting SAW apparatus.

However, in the SAW apparatus having the afore-mentioned construction, a space is required for wire bonding (electrode portion) as well as a space for mounting the SAW element on the active surface of the IC. Therefore, since the IC must be larger than the SAW element, the miniaturization of the SAW apparatus is limited. Further, since the mounting surfaces (electrode portions) of the SAW element and the IC must correspond to each other, the shape and the size of the electrode portions thereof are also limited. Also, since the IC and the SAW element are mounted by bonding their active surfaces to each other, the heat generated during the mounting process may adversely affect the active surfaces.

Accordingly, the present invention aims to solve the aforementioned problems, and it is an object of the present invention to provide a small SAW apparatus without limiting the size and the mounting position of the semiconductor integrated circuit and SAW element, and without adversely affecting the active surfaces by the mounting process.

SUMMARY

In order to achieve the above objects, a surface acoustic apparatus according to the present invention comprises a semiconductor integrated circuit (IC) and a surface acoustic wave device which are formed in a package, and the semiconductor IC and the SAW element are bonded to each other on their non-active surfaces. Therefore, it is possible to make the SAW apparatus small without limiting the size and the mounting position of the semiconductor integrated circuit and SAW element, and the active surfaces are not affected by the mounting process.

Further, according to a SAW apparatus comprising a semiconductor IC and a SAW element which are formed in a package, one of the semiconductor IC and the SAW element is flip-chip mounted on the bottom of the package, a non-active surface of the other one (that is not flip-chip mounted) is bonded to a non-active surface of the one that is flip-chip mounted on the bottom of the package.

According to the above construction, it is possible to make the SAW apparatus small without limiting the size and the mounting position of the semiconductor integrated circuit and SAW element, and the active surfaces are not affected by the mounting process. Further, because there is no limitation in size, a component may be used commonly among a plurality of products, and thus it is possible to produce devices with low cost. Further, when the semiconductor IC is flip-chip mounted on the substrate, even though plasma or ions are irradiated to the SAW element, the plasma or ions are not irradiated to the active surface of the semiconductor IC, which is not affected on the active surface of the IC.

Further, the non-active surface of the non-flip-chip mounted one of the IC and SAW element may be bonded to both the non-active surface of the flip-chip mounted one of the IC and SAW element and the package. As such, even when the non-active surface of the non-flip-chip mounted one is larger than the non-active surface of the flip-chip mounted one, it is possible to provide stable mounting.

A plurality of the non-flip-chip mounted ones of the IC and SAW element may be bonded to the non-active surface flip-chip mounted one, and thus the SAW apparatus can have various functions. Further, because the SAW element and the semiconductor IC are stacked on one another, it is possible to make the package small even though the number of devices to be mounted in the package is increased.

DETAILED DESCRIPTION

Figure 1:
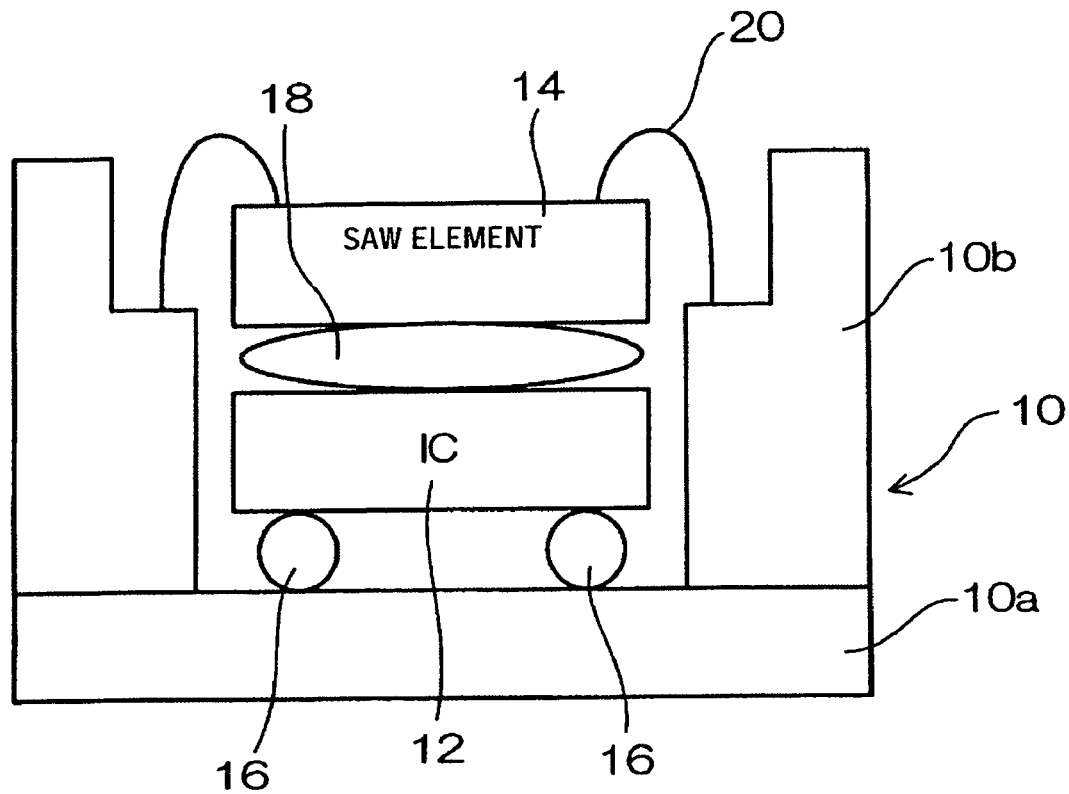
FIG. 1 is a view showing a first embodiment of the SAW apparatus according to the present invention.

Hereinafter, a SAW apparatus according to the present invention will be further described with reference to the drawings. FIG. 1 shows a first embodiment of the SAW apparatus according to the present invention.

A basic construction of the present embodiment comprises a package 10 having a mounting space (cavity) for mounting a device, a semiconductor integrated circuit (hereinafter, referred to as IC) 12 mounted in the package 10, and a surface acoustic wave (hereinafter, referred to as SAW) element 14 bonded to the IC 12.

The package 10 may have a bottom 10a and side walls 10b. Further, an electrode pattern (not shown) for mounting the IC 12 and the SAW element 14 is formed in the package 10.

The IC 12 is preferably an integrated circuit having an oscillator circuit, etc. and may be flip-chip mounted on the bottom 10a. According to a flip-chip mounting method, IC 12 is mounted such that a mounting surface of the bottom 10a faces an active surface of the IC 12. In general, the IC is mounted by a connection between the electrodes using a bump (protruded electrode) 16. A material of the bump 16 is preferably a solder. If Au is used as the material of the bump, the electrical conduction can be maintained satisfactorily. A non-active surface of the IC 12 mounted as mentioned above is in a direction facing the upper side of the drawing.

It is preferable that the SAW element 14 be bonded to the non-active surface of the IC 12 as mentioned above. When the SAW 14 is bonded to the IC 12, the non-active surface of the SAW element 12 faces the non-active surface of the IC 12. The bonding process may be performed using an adhesive 18. Since the bonding process does not accompany the mounting, the adhesive 18 does not need to have electrical conductivity.

In the SAW element 14 provided as mentioned above, the active surface faces the upper side of the drawing. It is preferable that an electrode portion (not shown) provided on the active surface of the SAW element 14 is wire-bonded to the electrode pattern (not shown) formed on the side walls 10b by wires 20.

The SAW apparatus forms the package 10 by bonding the bottom 10a and the side walls 10b. The bonding process may be performed using the adhesive. A pattern for mounting the IC 12 is formed on the bottom 10a of the package 10, and the bump 16 is formed in the mounting portion. IC 12 is flip-chip mounted with the bump 16 interposed therebetween. The non-active surface of the flip-chip mounted IC 12 faces the upper side of the drawing. The SAW element 14 is bonded to the non-active surface of the IC 12 such that the non-active surface of the IC 12 faces the non-active surface of the SAW element 14. It is preferable that the adhesive 18 be applied on at least one of the non-active surface of the IC 12 and the non-active surface of the SAW element 14.

In the SAW element 14 bonded as mentioned above, the active surface faces upwardly in the drawing. It is preferable that the electrode portion provided on the active surface of the SAW element 14 is wire-bonded to the electrode pattern formed on the side walls 10b of the package 10 by wires 20.

In the SAW apparatus as mentioned above, since the IC 12 and the SAW element 14 are stacked in the package 10, it is possible to reduce the mounting space (cavity) in the package 10, and to substantially miniaturize the SAW apparatus. Further, when viewing the SAW apparatus from the upper side of the drawing, the active surface of the IC 12 faces the bottom 10a (lower side). Thus, when plasma or ions are irradiated to the SAW element 14, the plasma or ions are prevented from reaching the IC 12.

Figure 2:
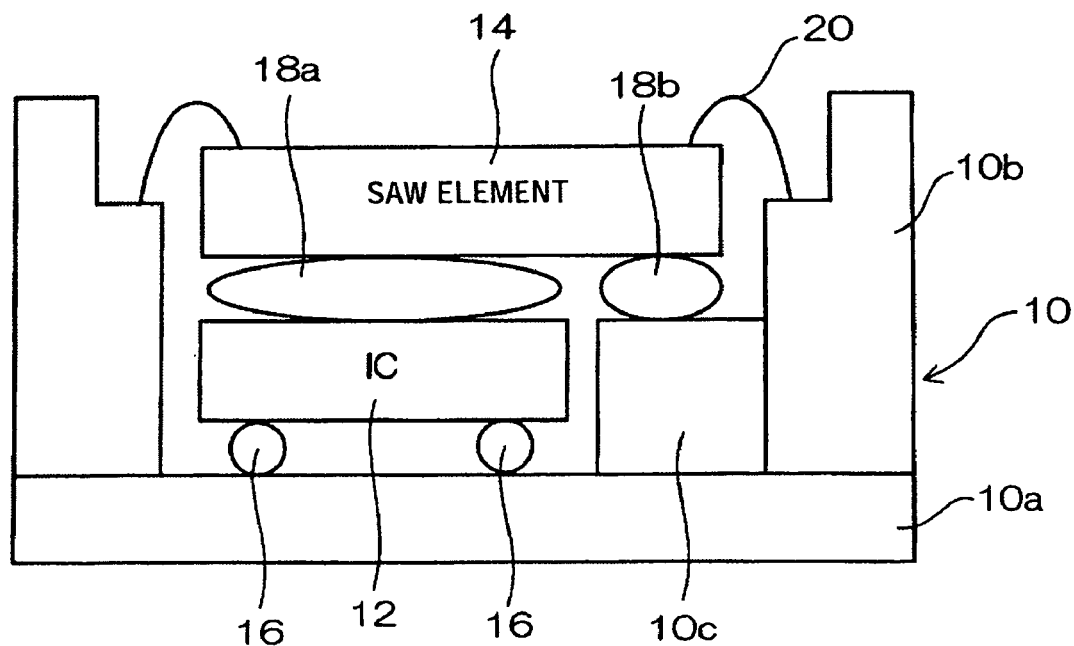
FIG. 2 is a view showing an alternate version of the first embodiment of the SAW apparatus according to the present invention.

FIG. 2 shows another embodiment to which the first embodiment is applied. A basic construction and manufacturing process of the present embodiment are almost same as the first embodiment. Therefore, the same portions are denoted with the same reference numerals, and a duplicate explanation thereof will be omitted.

The difference between the first embodiment and the present embodiment is the sizes of the SAW element 14 and IC 12. That is, in the first embodiment, the size of the IC 12 is almost same as the size of the SAW element 14, and the SAW element 14 is stably bonded to the upper surface of the IC 12. In contrast, in the present embodiment, the SAW element 14 is larger than the IC 12. Thus, a larger cavity is needed during the mounting process. In general, the size of the SAW element 14 becomes large as the frequency decreases.

In the above embodiment, an auxiliary substrate 10c is additionally provided in the package 10. The auxiliary substrate 10c is bonded so as to contact with the surface of the inner wall of the side wall 10b on the top surface of the bottom 10a. When the SAW element 14 is bonded to the IC 12, a portion protruding from the IC 12 may also be bonded, e.g., to the auxiliary substrate 10c.

In this regard, during the mounting the SAW element 14, even when a larger mounting area than the non-active surface of the IC 12 is required, it is still possible to stably provide the SAW element 14.

According to the SAW apparatus having the above construction, the bottom 10a is bonded to the side walls 10b, and the auxiliary substrate 10c is bonded to both to form the package 10. The bonding may be performed using an adhesive. On the bottom 10a of the package 10, an electrode pattern (not shown) for mounting the IC 12 is formed. Bumps 16 are formed on the mounting portion. The IC 12 is flip-chip mounted by the bump 16. The non-active surface of IC 12 that is flip-chip mounted faces upwardly in the drawing. The SAW element 14 is bonded to the non-active surface of the IC 12. In bonding the SAW element 14, in the case that the SAW element 14 is larger than the IC 12 and the bonding may be unstably performed, it is preferable to additionally stabilize the bonding by providing a bonding portion on the top surface of the auxiliary substrate 10c. As in the first embodiment, bonding is performed so the non-active surfaces face each other. The IC 12 and the SAW elements 14 are bonded by applying the adhesive 18a on at least one of the non-active surfaces of the SAW element 14 and IC 12. When using the auxiliary substrate 10c for bonding, it is preferable to bond two or three surfaces by applying, in addition to the adhesive 18a, an adhesive 18b on at least one of the non-active surface of the SAW element 14 and a top surface of the auxiliary substrate 10c. The adhesive 18a and the adhesive 18b are preferably made of the same materials but may be different materials.

In the SAW device 14 bonded as mentioned above, the active surface faces upwardly in the drawing. The electrode portion (not shown) disposed on the active surface of the SAW device 14 is wire-bonded to the electrode pattern (not shown) formed on the side wall 10b of the package 10 through the wires 20.

In the SAW apparatus as mentioned above, since the IC 12 and the SAW element 14 are stacked in the package 10, it is possible to reduce the mounting space (cavity) in the package 10, and to substantially miniaturize the SAW apparatus. Further, when viewing the SAW apparatus from the upper side of the drawing, the active surface of the IC 12 faces the bottom 10a (lower side). Thus, when plasma or ions are irradiated to the SAW element 14, the plasma or ions are prevented from reaching the IC 12. Furthermore, even when the SAW element 14 is larger than the IC 12, it is still possible to stably mount the SAW element 14.

Figure 3:
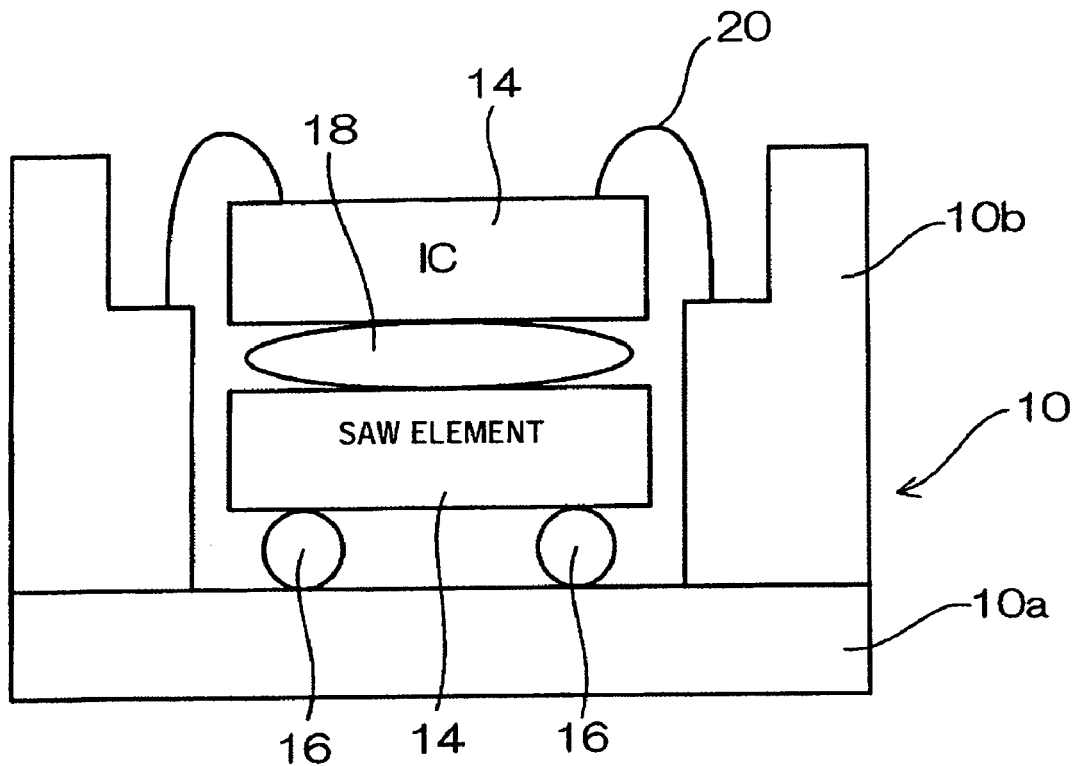
FIG. 3 is a view showing a second embodiment of the SAW apparatus according to the present invention.

A second embodiment of the SAW apparatus according to the present invention will now be explained with reference to FIG. 3. Basic members of the embodiment are almost same as the first embodiment. Therefore, the same members are denoted with the same reference numerals, and a duplicate explanation thereof will be omitted.

The difference between the first embodiment and the present embodiment is that the SAW element 14 and IC 12 are reversely arranged. That is, the SAW element 14 is flip-chip mounted on the bottom 10a via the bumps 16. The non-active surface of the IC 12 is bonded to the non-active surface of the SAW element 14 by using the adhesive 18. The IC 12 bonded to the non-active surface of the SAW device 14 is wire-bonded by bonding the electrode portion (not shown) arranged on the active surface thereof to the electrode pattern (not shown) formed in the side walls 10b by the wires 20.

According to the above construction, it is possible to prevent adverse affects on the active surfaces due to the heat generated while bonding the IC 12 and SAW element 14 and limitations in size and mounting position. Further, it is still possible to make the SAW apparatus small.

Figure 4:
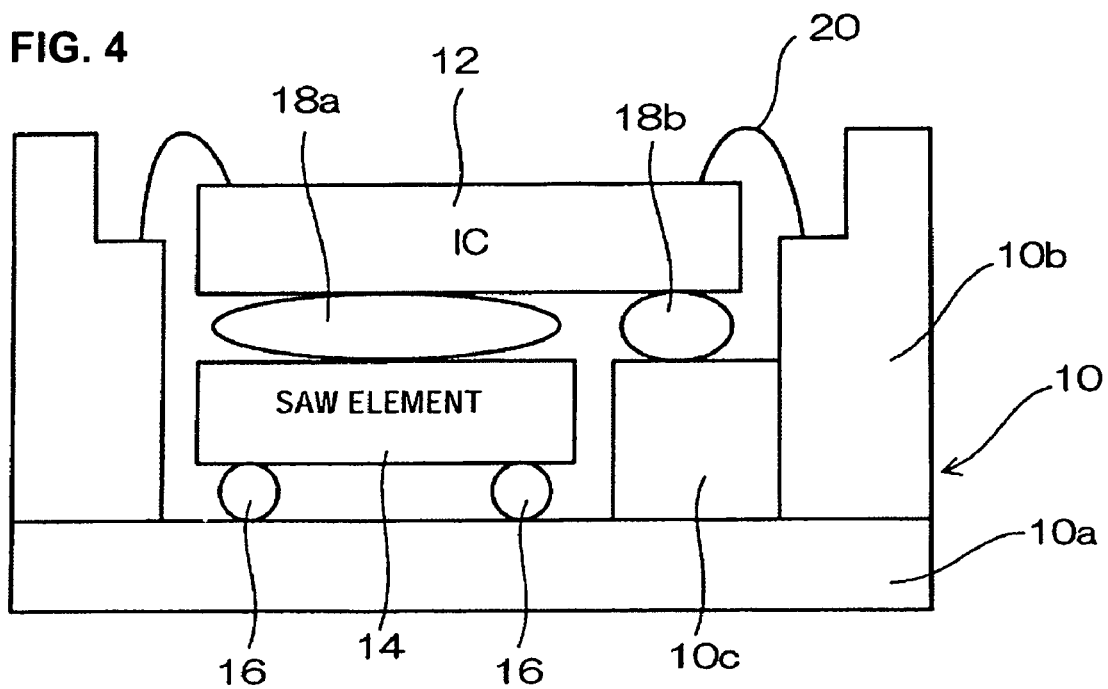
FIG. 4 is a view showing an alternate version of the second embodiment of the SAW apparatus according to the present invention.

FIG. 4 shows another embodiment to which the second embodiment is applied. The present embodiment has the same members as the applied embodiment of the first embodiment. Therefore, a second detailed explanation will be omitted.

Figure 5:
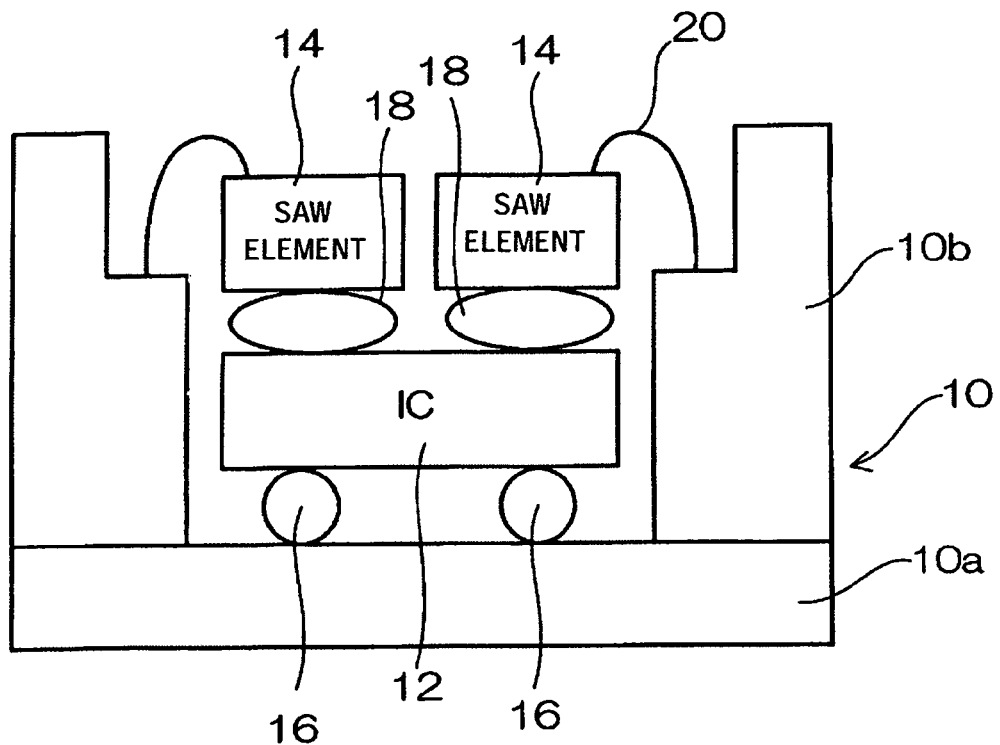
FIG. 5 is a view showing an application of the embodiment according to the present invention, which comprises a plurality of elements arranged on the upper side.

According to the present embodiment, although a single IC 12 and a single SAW element 14 are mounted in the package 10, as shown in FIG. 5, a plurality of SAW elements 14 for bonding to the non-active surface of the IC 12 may be provided. In this regard, the SAW elements 14 may be bonded to the non-active surface of the IC 12 and a portion of the package 10 (not shown). Further, the SAW elements 14 and the semiconductor IC 12 may be exchanged for each other.

Figure 6:
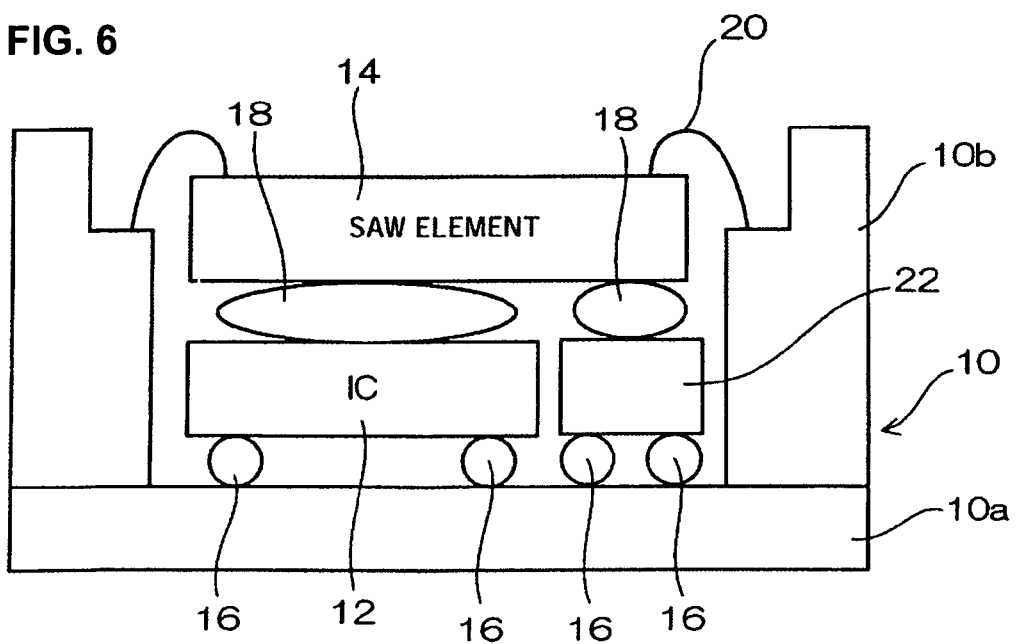
FIG. 6 is a view showing an application of the embodiment according to the present invention, which comprises a plurality of element flip-chip mounted.
Figure 7:
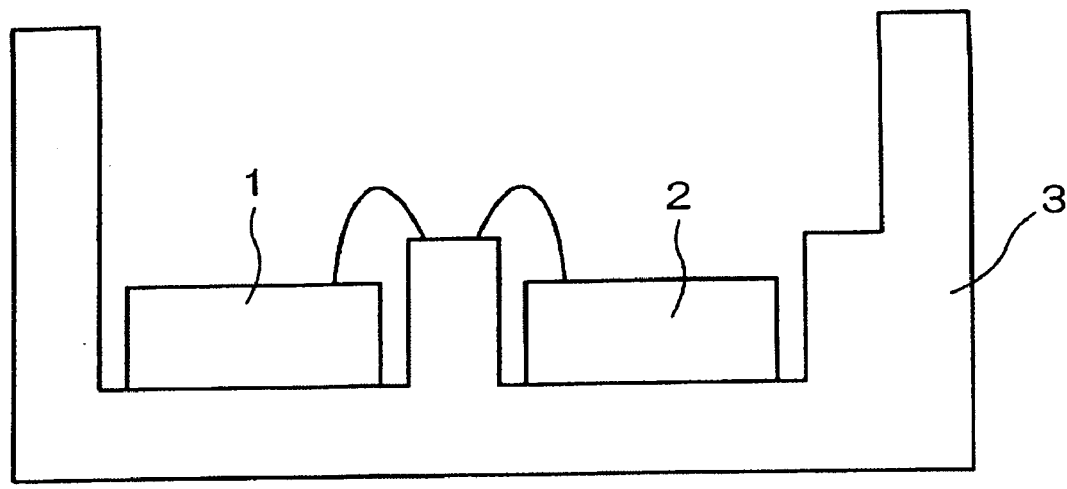
FIG. 7 is a view showing a general construction of the conventional SAW apparatus.
Figure 8:
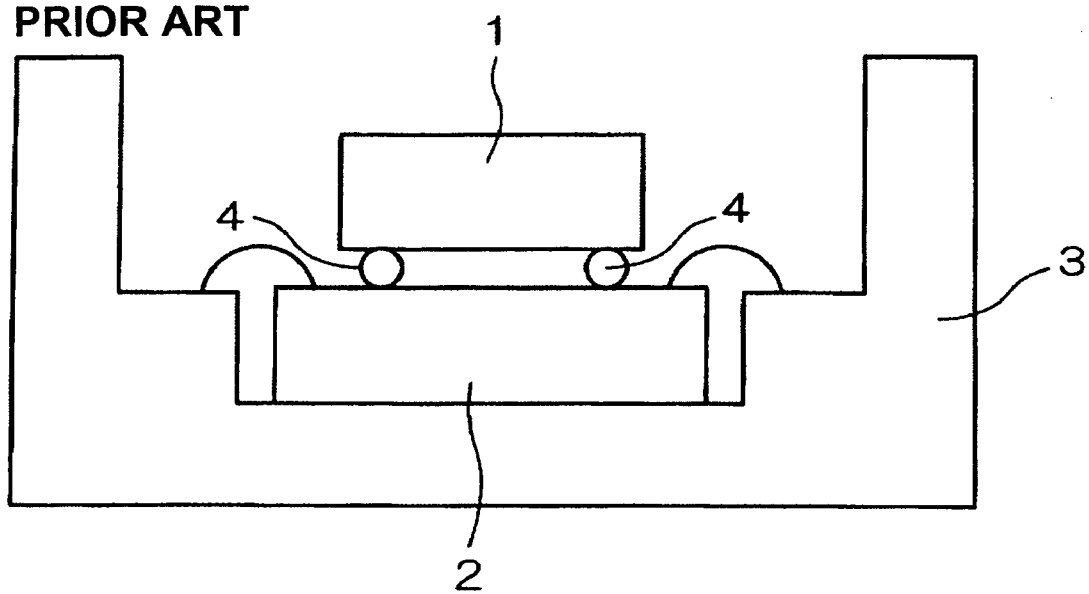
FIG. 8 is a view showing a conventional proposal embodiment of the SAW apparatus.

Further, as shown in FIG. 6, it is still possible to mount electronic elements 22 such as a capacitor or resistor in the position where the auxiliary substrate 10c according to the above embodiment is bonded. In this regard, it is possible to exchange the IC 12 and the SAW element 14. Further, one of the plurality of SAW devices 14 shown in FIG. 5 may replace the electronic element 22 shown in FIG. 6.

According to the respective embodiments, in the SAW apparatus comprising the IC 12 and the SAW element 14, the non-active surfaces of both the IC 12 and the SAW element 14 are bonded to each other to mount in the package 10. Therefore, it is possible to prevent adverse affects on the active surfaces during bonding, and limitations in size and mounting position. Further, it is still possible to make the SAW apparatus small.

Furthermore, according to the SAW apparatus comprising the IC 12 and the SAW element 14, the IC 12 is flip-chip mounted on the bottom 10a, the non-active surface of the SAW element 14 is bonded to the non-active surface of the IC 12, and the active surface of the SAW element 14 is wire-bonded to the side walls 10b. When the IC 12 is bonded to the SAW element 14 in this manner, it is possible to prevent adverse affects on the active surfaces during bonding, limitations in size and mounting position, and to make the SAW apparatus small. Because the IC 12 is flip-chip mounted on the bottom 10a, even when plasma or ions are irradiated to the SAW element 14, the plasma or ions do not adversely affect the active surface of the IC 12.

Further, because the non-active surface of the SAW element 14 is bonded to the non-active surface of the IC 12 and the auxiliary substrate 10c, even though the SAW element 14 is larger than the IC 12, it is possible to stably mount the SAW element.

Furthermore, according to the SAW apparatus comprising the IC 12 and the SAW element 14, the SAW element 14 is flip-chip mounted on the bottom 10a, the non-active surface of the IC 12 is bonded to the non-active surface of the SAW element 14, and the active surface of the IC 12 is wire-bonded to the side walls 10b. Thus, when the IC 12 is bonded to the SAW element 14, it is possible to make the SAW apparatus small without adversely affecting the active surfaces due to the heating and without limitations on size or mounting position.

Further, the non-active surface of the IC 12 is preferably bonded to the non-active surface of the SAW element 14 and auxiliary substrate 10c. Thus, even when the IC 12 is larger than the SAW element 14, it is possible to stably mount the IC 12.

The SAW apparatus can have various functions by having a plurality of non-flip-chip mounted ones of the IC 12 and the SAW element 14 bonded to the non-active surface the other of the IC 12 and the SAW element 14. Further, because the SAW element 14 and the IC 12 are mounted so as to be stacked, even though the number of the elements to be mounted in the package increases, it is possible to make the package small.

Further, in the respective embodiments, the package 10 is formed by bonding the bottom 10a and the side walls 10b or auxiliary substrate 10c, but it is preferable to pre-form it as one body.

Further, according to the above construction, because it is possible to simplify the structure of the cavity of the package, it is still possible to disperse the stress which is concentrated to the corners of the bonding portions.

What is claimed is:

1. A surface acoustic wave apparatus comprising:
   a semiconductor integrated circuit (IC) flip-chip mounted on a bottom of a package; and
   a surface acoustic wave (SAW) element, wherein a non-active surface of the SAW element is bonded to a non-active surface of the semiconductor IC and the SAW element is larger than the semiconductor IC,
   wherein the SAW element overhangs the semiconductor IC and is non-conductively connected to an auxiliary substrate.

2. A surface acoustic wave apparatus comprising:
   a package having a cavity defined by a bottom and sidewalls of the package;
   a semiconductor integrated circuit (IC) disposed in the cavity, the semiconductor IC having an active surface and a non-active surface; and a surface acoustic wave (SAW) element disposed in the cavity and connected to the semiconductor IC, the SAW element having an active surface and a non-active surface;

wherein:
the active surface of the semiconductor IC is conductively connected to the bottom of the package;
the active surface of the SAW element is conductively connected to the sidewall of the package;
the semiconductor IC and the SAW element are non-conductively bonded to each other on their non-active surfaces; and
the SAW element is larger than the semiconductor IC.

3. The SAW apparatus according to claim 2, wherein the semiconductor IC is conductively connected to the bottom of the package through a bump electrode.

4. The SAW apparatus according to claim 2, wherein the SAW element is conductively connected to the sidewalls of the package through wire bonding.

5. The SAW apparatus according to claim 2 further comprising an auxiliary substrate formed on the bottom of the package, wherein the SAW element overhangs the semiconductor IC and is non-conductively connected to the auxiliary substrate.

6. The SAW apparatus according to claim 2, further comprising a plurality of the SAW elements conductively connected to the sidewalls of the package and non-conductively connected to the semiconductor IC.

7. A surface acoustic wave apparatus comprising:
a semiconductor integrated circuit (IC) flip-chip mounted on a bottom of a package;
a surface acoustic wave (SAW) element that is larger than the semiconductor IC, wherein a non-active surface of the SAW element is bonded to a non-active surface of the semiconductor IC; and
an auxiliary substrate formed on the bottom of the package, wherein the SAW element overhangs the semiconductor IC and is non-conductively connected to the auxiliary substrate.

8. A surface acoustic wave apparatus comprising:
a package having a cavity defined by a bottom and sidewalls of the package;
a semiconductor integrated circuit (IC) disposed in the cavity, the semiconductor IC having an active surface and a non-active surface; and
a surface acoustic wave (SAW) element disposed in the cavity and connected to the semiconductor IC, the SAW element having an active surface and a non-active surface;

wherein:
the active surface of the semiconductor IC is conductively connected to the bottom of the package;
the active surface of the SAW element is conductively connected to the sidewalls of the package;
the semiconductor IC and the SAW element are bonded to each other on their non-active surfaces; and
the SAW element is larger than the semiconductor IC.

* * * * *